(12) United States Patent
Yuan et al.

(10) Patent No.: US 11,027,863 B2
(45) Date of Patent: Jun. 8, 2021

(54) METHOD AND SYSTEM FOR CONTROLLING AXIAL LENGTH OF ELLIPSOIDAL SHELLS BASED ON LIQUID VOLUME LOADING

(71) Applicant: Harbin Institute of Technology

(72) Inventors: Shijian Yuan, Harbin (CN); Xiaolei Cui, Harbin (CN)

(73) Assignee: Harbin Institute of Technology, Harbin (CN)

( * ) Notice: Subject to any disclaimer, the term of this patent is extended or adjusted under 35 U.S.C. 154(b) by 0 days.

(21) Appl. No.: 16/715,093

(22) Filed: Dec. 16, 2019

(65) Prior Publication Data

US 2021/0130016 A1 May 6, 2021

(30) Foreign Application Priority Data

Nov. 4, 2019 (CN) .......................... 201911064745.3

(51) Int. Cl.
*B21D 26/02* (2011.01)
*B65B 3/36* (2006.01)
(Continued)

(52) U.S. Cl.
CPC ............... *B65B 3/36* (2013.01); *B21D 26/02* (2013.01); *B29D 22/003* (2013.01); *B65D 88/04* (2013.01)

(58) Field of Classification Search
CPC ..... B21D 26/02; B21D 26/027; B21D 26/041
(Continued)

(56) References Cited

U.S. PATENT DOCUMENTS 3,335,590 A * 8/1967 Early .................. B21D 26/047
72/58
4,708,008 A * 11/1987 Yasui .................. B21D 26/055
29/421.1
(Continued)

FOREIGN PATENT DOCUMENTS

CN 108994141 A * 12/2018

OTHER PUBLICATIONS

Machine translation of CN10899414A, Liu et al. pp. 1-8, translated on Apr. 20, 2020. (Year: 2020).*

*Primary Examiner* — Teresa M Ekiert
(74) *Attorney, Agent, or Firm* — Troutman Pepper Hamilton Sanders LLP; Christopher C. Close, Jr.

(57) ABSTRACT

The present invention discloses a method and system for controlling axial length of an ellipsoidal shell based on liquid volume loading. The method includes: determining the volume calculation models of an unformed prefabricated shell and a formed ellipsoidal shell; determining a calculation model of a volume difference between the unformed prefabricated shell and the formed ellipsoidal shell; determining a structure size of the unformed prefabricated shell according to a target axial length of the formed ellipsoidal shell; obtaining the volume difference between the formed ellipsoidal shell and the unformed prefabricated shell, and recording the volume difference as a target volume; injecting liquid into the unformed prefabricated shell with target volume to obtain the formed ellipsoidal shell. The forming process in the present invention is simple and easy to implement without considering differences in materials and wall thicknesses and can control and adjust the axial length dimension accuracy of a shell.

4 Claims, 8 Drawing Sheets

(51) Int. Cl.
 *B29D 22/00* (2006.01)
 *B65D 88/04* (2006.01)
(58) Field of Classification Search
 USPC .............................................. 72/54
 See application file for complete search history.

(56) References Cited

U.S. PATENT DOCUMENTS

| | | | |
|---|---|---|---|
| 6,601,423 B1 * | 8/2003 | Peterson | B21D 3/14 |
| | | | 29/421.1 |
| 2004/0007037 A1 * | 1/2004 | Yoshino | B21D 9/15 |
| | | | 72/369 |

* cited by examiner

```
┌─────────────────────────────────────────────────────────────┐
│ Design an unformed prefabricated shell of a target ellipsoidal container │──  Step 1
│ with an axial length ratio greater than √2 to an ellipsoidal shell structure │
│ with double axial length ratios                             │
└─────────────────────────────────────────────────────────────┘
                              ↓
┌─────────────────────────────────────────────────────────────┐
│ Obtain an inner-cavity volume of the target ellipsoidal container and an │──  Step 2
│ inner-cavity volume of the prefabricated shell, and establish a relation │
│ model of a volume change of the shell before and after the forming │
└─────────────────────────────────────────────────────────────┘
                              ↓
┌─────────────────────────────────────────────────────────────┐
│ Conduct reversing design of parameters and a volume change rate of the │── Step 3
│ prefabricated ellipsoidal shell structure with double axial length ratios │
└─────────────────────────────────────────────────────────────┘
                              ↓
┌─────────────────────────────────────────────────────────────┐
│                                                             │──  Step 4
│              Determine a liquid volume increment            │
│                                                             │
└─────────────────────────────────────────────────────────────┘
                              ↓
┌─────────────────────────────────────────────────────────────┐
│ Inject liquid into the prefabricated shell with double axial length ratios, │── Step 5
│ and control the axial lengths of the ellipsoidal shell according to the │
│ liquid volume increment to form the ellipsoid container with an axial │
│ length ratio greater than √2                                │
└─────────────────────────────────────────────────────────────┘
```

*Fig. 2*

METHOD AND SYSTEM FOR CONTROLLING AXIAL LENGTH OF ELLIPSOIDAL SHELLS BASED ON LIQUID VOLUME LOADING

TECHNICAL FIELD

The present invention relates to the field of ellipsoidal vessels fabrication technologies, and in particular, to a control method and system for axial length of an ellipsoidal shell based on liquid volume loading.

BACKGROUND

Ellipsoidal vessels are widely used in fields such as the petrochemical industry, water supply engineering, pressure vessels, and architectural decoration. Especially, an oblate ellipsoidal shell whose axial length ratio $\lambda$ (a ratio of a long-axis length to a short-axis length) greater than $\sqrt{2}$ is an ideal structure of a large water tower tank because of its advantages such as low gravity center, bearing small wind load, and attractive appearance. In addition, in the aerospace field, a tank dome of a launch vehicle is usually of an oblate ellipsoid structure, and has advantages of effective space saving, high structure bearing performance, and the like.

A conventional forming and fabrication method of an ellipsoidal vessel is to conduct die pressing on a shell plate based on blocks, and conduct welding to form a whole ellipsoidal shell. In this method, a large die and a press machine are required, and therefore, fabrication costs are relatively high. Besides, once the diameter and the wall thickness of a product change, a new die needs to be fabricated, and consequently there is poor adaptability to the product change. For a large ellipsoidal vessel, a plurality of dies are required to meet requirements. Therefore, fabrication costs of the ellipsoidal vessels are excessively high and a fabrication cycle of the ellipsoidal vessels is excessively long.

To resolve the problem existing in fabrication of an ellipsoidal vessel, an overall die-less hydroforming method for the ellipsoidal vessels was proposed and developed. Because curvatures of different positions on an elliptical shell are different, stress states at the positions are different, and the elliptical shell is not simply expanded and deformed during hydroforming. It is shown by theoretical and experimental researches that whether an ellipsoidal vessel can be formed successfully is closely related to an axial length ratio $\lambda$ of the ellipsoidal vessel. When hydroforming is conducted on an ellipsoidal shell whose axial length ratio is $1 \leq \lambda < \sqrt{2}$ (when $\lambda=1$, the ellipsoidal vessel is a spherical vessel), a qualified product can be smoothly formed. While for an ellipsoidal shell whose axial length ratio is $\lambda > \sqrt{2}$, instability and wrinkling will occur during forming under the action of internal pressure due to the action of zonal compression stress near the equatorial belt, and a qualified product cannot be formed. For the problem that instability and wrinkling occur at the equatorial belt of an ellipsoidal vessel whose axis length ratio is $\lambda > \sqrt{2}$, a hydroforming method of an ellipsoidal vessel with double axial length ratios (patent number: ZL201310628487.3) has been proposed. A basic idea is that: a prefabricated shell is designed to a structure with double axial length ratios before hydroforming of the ellipsoidal vessel, an area between a tension-compression stress dividing angle and an equator line where annular instability and wrinkling generated is replaced by a segment of ellipsoidal shell whose axial length ratio is $1 \leq \lambda < \sqrt{2}$ and another segment of ellipsoidal shell whose axial length ratio is $\lambda > \sqrt{2}$, so as to ensure that the whole ellipsoidal vessel with double axial length ratios is not subject to zonal compression stress under the action of internal pressure. With the increase of the internal pressure, the prefabricated shell with double axial length ratios gradually produces plastic deformation, while a short axis is significantly extended and a long axis is only slightly shortened. Finally, when the internal pressure reaches a specific value (which is usually 1.0-1.1 $p_s$, where $p_s$ is yield internal pressure), curvature radiuses of the two segments of ellipsoidal shells become the same, forming an ellipsoidal vessel with an axial length ratio of $\lambda > \sqrt{2}$. As the internal pressure continues to increase, the axial length ratio $\lambda$ of the ellipsoidal vessel gradually decreases.

During die-less hydroforming, a shell is not externally constrained, and therefore how to control the precision of a curvature radius of the shell is a key of the die-less hydroforming of the shell. As mentioned above, control is mainly conducted by pressure loading currently. For a spherical vessel, a diameter of the shell is adjusted by controlling the forming pressure based on a forming pressure-diameter quantitative relation model (forming pressure is $$p = \frac{2t}{d}\sigma_s,$$

where p is forming pressure, t is a wall thickness, d is a diameter of the spherical vessel, and $\sigma_s$ is yield strength of a vessel material). However, during hydroforming of an ellipsoidal shell with an axial length ratio $1 < \lambda < \sqrt{2}$, because curvature radiuses of different positions on the elliptical shell are different, two poles are first deformed, then an area on the shell at high latitudes is deformed and the deformation gradually extends to an equatorial region, and finally the equatorial region is deformed. During hydroforming of an ellipsoidal shell with double axial length ratios, the deformation process is more complex. Therefore, it is impossible to control the dimension accuracy of a long axis and a short axis of the ellipsoidal shell by pressure loading. For a target ellipsoidal vessel of a specific dimension with an axial length ratio $\lambda > \sqrt{2}$, a specific dimension of a used prefabricated ellipsoidal shell with double biaxial length ratios and specific internal pressure under which the ellipsoidal vessel of a target dimension can be obtained cannot be determined in advance.

SUMMARY

An object of the present invention is to provide a method and system for controlling axial length of an ellipsoidal shell based on liquid volume loading. This can make a forming process of an ellipsoidal vessel simple and easy to implement without considering differences in materials and wall thicknesses during forming, and make the dimension accuracy of an axial length of a shell controllable and adjustable, thereby being suitable for fabricating large-size ellipsoidal vessel on site.

To achieve the above purpose, the present invention provides the following technical solutions.

A method for controlling axial length of an ellipsoidal shell based on liquid volume loading includes:

determining a volume calculation model of an unformed prefabricated shell and a volume calculation model of a formed ellipsoidal shell, where the unformed prefabricated shell is hydro-bulged to obtain the formed ellipsoidal shell after liquid loading; the unformed prefabricated shell is symmetrical with respect to its center; the unformed prefabricated shell includes a plurality of segments of ellipsoidal shells; and the plurality of segments of ellipsoidal shells include ellipsoidal shells from different ellipsoids;

determining a calculation model of a volume difference between the unformed prefabricated shell and the formed ellipsoidal shell according to the volume calculation model of the unformed prefabricated shell and the volume calculation model of the formed ellipsoidal shell;

obtaining a target axial length of the formed ellipsoidal shell, where the target axial length is determined according to a requirement;

determining a structure size of the unformed prefabricated shell according to the target axial length of the formed ellipsoidal shell;

substituting the target axial length of the formed ellipsoidal shell and the structure size of the unformed prefabricated shell into the volume difference calculation model, to obtain the volume difference between the formed ellipsoidal shell and the unformed prefabricated shell, and recording the volume difference as a target volume; and fabricating the unformed prefabricated shell according to the structure size of the unformed prefabricated shell, and injecting liquid whose volume is the target volume into the unformed prefabricated shell to obtain the formed ellipsoidal shell.

Optionally, the unformed prefabricated shell is from two different ellipsoids, which are respectively recorded as a first ellipsoid and a second ellipsoid; an upper ellipsoidal shell and a lower ellipsoidal shell (a first segment of ellipsoidal shell) of the unformed prefabricated shell is from the first ellipsoid; a middle ellipsoidal shell (a second segment of ellipsoidal shell) of the unformed prefabricated shell is from the second ellipsoid; and $\lambda_1 > \sqrt{2}$ and $1 < \lambda_2 < \sqrt{2}$, where $\lambda_1$ is an axial length ratio of the first ellipsoid, and $\lambda_2$ is an axial length ratio of the second ellipsoid.

Optionally, the determining a volume calculation model of an unformed prefabricated shell specifically includes determining the volume calculation model of the unformed prefabricated shell as $$V_0 = \frac{4\pi a_1^3}{3\lambda_1}\left(1 - \sqrt{\frac{\lambda_1^4}{\cot^2\alpha_0 + \lambda_1^4}}\right) + \frac{4\pi a_2^3}{3\lambda_2}\sqrt{\frac{\lambda_2^4}{\cot^2\alpha_0 + \lambda_2^4}},$$

where $V_0$ is a volume of the unformed prefabricated shell; $a_1$ is a length of a semi-major axis of the first ellipsoid; $a_2$ is a length of a semi-major axis of the second ellipsoid; and $\alpha_0$ is a tension-compression stress dividing angle; and $$\alpha_0 = \arctan\frac{\sqrt{\lambda_1^2 - 2}}{\lambda_1^2}.$$

Optionally, the determining a calculation model of a volume difference between the unformed prefabricated shell and the formed ellipsoidal shell according to the volume calculation model of the unformed prefabricated shell and the volume calculation model of the formed ellipsoidal shell specifically includes:

determining the volume difference calculation model according to $$\Delta V = \frac{4\pi a_2^3}{3\lambda_F} - \frac{4\pi a_1^3}{3\lambda_1}\left(1 - \sqrt{\frac{\lambda_1^4}{\cot^2\alpha_0 + \lambda_1^4}}\right) - \frac{4\pi a_2^3}{3\lambda_2}\sqrt{\frac{\lambda_2^4}{\cot^2\alpha_0 + \lambda_2^4}},$$

where $\Delta V$ is the volume difference between the unformed prefabricated shell and the formed ellipsoidal shell, and $\lambda_F$ is an axial length ratio of the formed ellipsoidal shell.

A system for controlling axial length of an ellipsoidal shell based on liquid volume loading includes:

a volume calculation model determining module, configured to determine a volume calculation model of an unformed prefabricated shell and a volume calculation model of a formed ellipsoidal shell, where the unformed prefabricated shell is hydro-bulged to obtain the formed ellipsoidal shell after liquid loading; the unformed prefabricated shell is symmetrical with respect to its center; the unformed prefabricated shell includes a plurality of segments of ellipsoidal shells; and the plurality of segments of ellipsoidal shells include ellipsoidal shells from different ellipsoids;

a volume difference calculation model determining module, configured to determine a calculation model of a volume difference between the unformed prefabricated shell and the formed ellipsoidal shell according to the volume calculation model of the unformed prefabricated shell and the volume calculation model of the formed ellipsoidal shell;

a formed-ellipsoidal-shell target-axial-length obtaining module, configured to obtain a target axial length of the formed ellipsoidal shell, where the target axial length is determined according to a requirement;

an unformed-prefabricated-shell structure size determining module, configured to determine a structure size of the unformed prefabricated shell according to the target axial length of the formed ellipsoidal shell;

a target volume calculation module, configured to substitute the target axial length of the formed ellipsoidal shell and the structure size of the unformed prefabricated shell into the volume difference calculation model, to obtain the volume difference between the formed ellipsoidal shell and the unformed prefabricated shell, and record the volume difference as a target volume; and an ellipsoidal shell fabrication module, configured to fabricate the unformed prefabricated shell according to the structure size of the unformed prefabricated shell, and inject liquid whose volume is the target volume into the unformed prefabricated shell to obtain the formed ellipsoidal shell.

Optionally, the unformed prefabricated shell is from two different ellipsoids, which are respectively recorded as a first ellipsoid and a second ellipsoid; an upper ellipsoidal shell and a lower ellipsoidal shell (a first segment of ellipsoidal shell) of the unformed prefabricated shell is from the first ellipsoid; a middle ellipsoidal shell (a second segment of ellipsoidal shell) of the unformed prefabricated shell is from the second ellipsoid, where the volume calculation model determining module includes:

a volume calculation model determining unit, configured to determine the volume calculation model of the unformed prefabricated shell as $$V_0 = \frac{4\pi a_1^3}{3\lambda_1}\left(1 - \sqrt{\frac{\lambda_1^4}{\cot^2\alpha_0 + \lambda_1^4}}\right) + \frac{4\pi a_2^3}{3\lambda_2}\sqrt{\frac{\lambda_2^4}{\cot^2\alpha_0 + \lambda_2^4}},$$

where $V_0$ is a volume of the unformed prefabricated shell; $a_1$ is a length of a semi-major axis of the first ellipsoid; $\lambda_1$ is an axial length ratio of the first ellipsoid; $\lambda_2$ is an axial length ratio of the second ellipsoid; $a_2$ is a length of a semi-major axis of the second ellipsoid; $\alpha_0$ is a tension-compression stress dividing angle; and $$\alpha_0 = \arctan\frac{\sqrt{\lambda_1^2 - 2}}{\lambda_1^2}, \lambda_1 > \sqrt{2},$$

and $1<\lambda_2<\sqrt{2}$.

Optionally, the volume difference calculation model determining module specifically includes:

a volume difference calculation model determining unit, configured to determine the volume difference calculation model according to $$\Delta V = \frac{4\pi a_2^3}{3\lambda_F} - \frac{4\pi a_1^3}{3\lambda_1}\left(1 - \sqrt{\frac{\lambda_1^4}{\cot^2\alpha_0 + \lambda_1^4}}\right) - \frac{4\pi a_2^3}{3\lambda_2}\sqrt{\frac{\lambda_2^4}{\cot^2\alpha_0 + \lambda_2^4}},$$

where $\Delta V$ is the volume difference between the unformed prefabricated shell and the formed ellipsoidal shell, and $\lambda_F$ is an axial length ratio of the formed ellipsoidal shell.

A liquid filling system used for the axial length control method for an ellipsoidal shell based on liquid volume loading of the present invention includes:

a liquid filling subsystem, configured to inject liquid into the unformed prefabricated shell of the present invention;

a flowmeter, configured to measure liquid flow output by the liquid filling subsystem; and a control subsystem, configured to determine a volume of the liquid injected into the unformed prefabricated shell according to measurement data of the flowmeter; and when the volume of the liquid reaches the target volume of the present invention, control the liquid filling subsystem to stop liquid filling.

According to specific embodiments provided in the present invention, the present invention discloses the following technical effects: The method for controlling axial length of an ellipsoidal shell based on liquid volume loading provided in the present invention includes: determining a volume calculation model of an unformed prefabricated shell and a volume calculation model of a formed ellipsoidal shell, where the unformed prefabricated shell includes a plurality of segments of ellipsoidal shells; and the plurality of segments of ellipsoidal shells include ellipsoidal shells from different ellipsoids; determining a calculation model of a volume difference between the unformed prefabricated shell and the formed ellipsoidal shell according to the volume calculation model of the unformed prefabricated shell and the volume calculation model of the formed ellipsoidal shell; obtaining a target axial length of the formed ellipsoidal shell, where the target axial length is determined according to a requirement; determining a structure size of the unformed prefabricated shell according to the target axial length of the formed ellipsoidal shell; substituting the target axial length of the formed ellipsoidal shell and the structure size of the unformed prefabricated shell into the volume difference calculation model, to obtain the volume difference between the formed ellipsoidal shell and the unformed prefabricated shell, and recording the volume difference as a target volume; and fabricating the unformed prefabricated shell according to the structure size of the unformed prefabricated shell, and injecting liquid whose volume is the target volume into the unformed prefabricated shell to obtain the formed ellipsoidal shell. In the present invention, the ellipsoidal shell is formed by controlling a volume of injected liquid. Compared with a forming method of an ellipsoidal shell in the prior art, the process of the present invention is simple and easy to implement without considering differences in materials and wall thicknesses during forming (but existing pressure control needs to be considered) and can control and adjust the dimension accuracy of an axial length of a shell, so as to be suitable for fabricating large-size ellipsoidal vessel on site.

BRIEF DESCRIPTION OF DRAWINGS

To describe the technical solutions in the embodiments of the present invention or in the prior art more clearly, the following briefly describes the accompanying drawings required in the embodiments. Apparently, the accompanying drawings in the following description show some embodiments of the present invention, and a person of ordinary skill in the art may still derive other drawings from these accompanying drawings without creative efforts.

FIG. 2 is a flowchart of an axial length control method for an ellipsoidal shell based on liquid volume loading according to another embodiment of the present invention;

DETAILED DESCRIPTION

The following clearly and completely describes the technical solutions in the embodiments of the present invention with reference to the accompanying drawings in the embodiments of the present invention. Apparently, the described embodiments are some rather than all of the embodiments of the present invention. All other embodiments obtained by a person of ordinary skill in the art based on the embodiments of the present invention without creative efforts shall fall within the protection scope of the present invention.

An object of the present invention is to provide a method and system for controlling axial length of an ellipsoidal shell based on liquid volume loading. This can make a forming method of an ellipsoidal vessel simple, so that a forming process of the ellipsoidal vessel is simple and easy to implement without considering differences in materials and wall thicknesses during forming. Moreover, it can control and adjust the dimension accuracy of an axial length of a shell, so as to be suitable for fabricating large-size ellipsoidal vessel on site.

To make the objectives, features, and advantages of the present invention more obvious and easier to understand, the following further describes the present invention in details with reference to the accompanying drawings and specific implementations.

Embodiment 1

Figure 1:
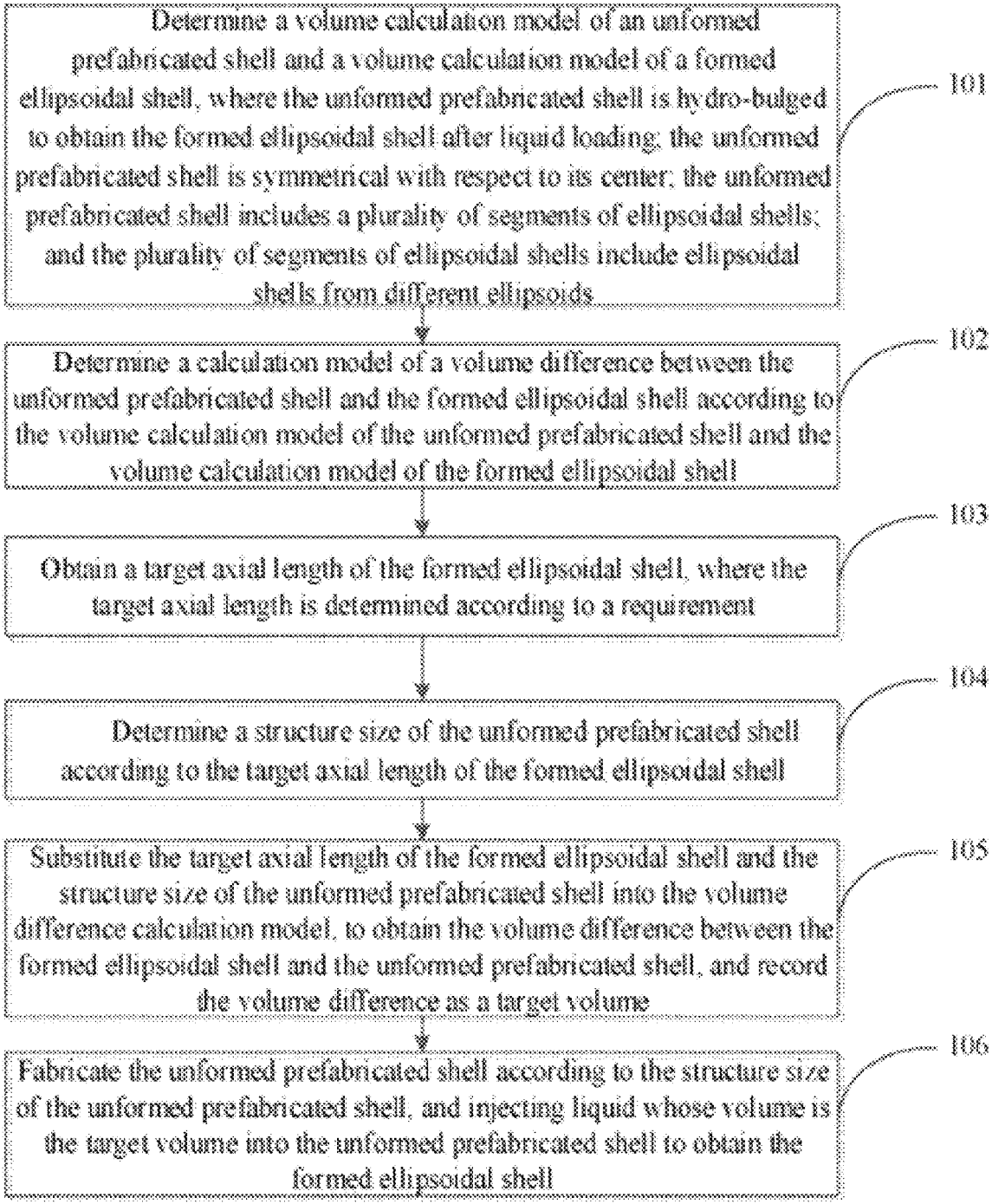
FIG. 1 is a flowchart of an axial length control method for an ellipsoidal shell based on liquid volume loading according to an embodiment of the present invention.

To resolve a problem existing in fabrication of an ellipsoidal vessel in the prior art, the present invention proposes an overall die-less hydroforming method for an ellipsoidal vessel based on liquid volume loading. As shown in FIG. 1, the method includes the following steps:

Step 101: Determine a volume calculation model of an unformed prefabricated shell and a volume calculation model of a formed ellipsoidal shell, where the unformed prefabricated shell is hydro-bulged to obtain the formed ellipsoidal shell after liquid loading; the unformed prefabricated shell is symmetrical with respect to its center; the unformed prefabricated shell includes a plurality of segments of ellipsoidal shells; and the plurality of segments of ellipsoidal shells include ellipsoidal shells from different ellipsoids.

Step 102: Determine a calculation model of a volume difference between the unformed prefabricated shell and the formed ellipsoidal shell according to the volume calculation model of the unformed prefabricated shell and the volume calculation model of the formed ellipsoidal shell.

Step 103: Obtain a target axial length of the formed ellipsoidal shell, where the target axial length is determined according to a requirement.

Step 104: Determine a structure size of the unformed prefabricated shell according to the target axial length of the formed ellipsoidal shell.

Step 105: Substitute the target axial length of the formed ellipsoidal shell and the structure size of the unformed prefabricated shell into the volume difference calculation model, to obtain the volume difference between the formed ellipsoidal shell and the unformed prefabricated shell, and record the volume difference as a target volume.

Step 106: Fabricate the unformed prefabricated shell according to the structure size of the unformed prefabricated shell, and injecting liquid whose volume is the target volume into the unformed prefabricated shell to obtain the formed ellipsoidal shell.

In this embodiment, the unformed prefabricated shell comes from two different ellipsoids, which are respectively recorded as a first ellipsoid and a second ellipsoid; an upper ellipsoidal shell and a lower ellipsoidal shell (a first segment of ellipsoidal shell) of the unformed prefabricated shell are from the first ellipsoid; and a middle ellipsoidal shell (a second segment of ellipsoidal shell) of the unformed prefabricated shell is from the second ellipsoid. $\lambda_1 > \sqrt{2}$, and $1 < \lambda_2 < \sqrt{2}$, where $\lambda_1$ is an axial length ratio of the first ellipsoid; and $\lambda_2$ is an axial length ratio of the second ellipsoid.

The volume calculation model of the unformed prefabricated shell in step 101 is $$V_0 = \frac{4\pi a_1^3}{3\lambda_1}\left(1 - \sqrt{\frac{\lambda_1^4}{\cot^2\alpha_0 + \lambda_1^4}}\right) + \frac{4\pi a_2^3}{3\lambda_2}\sqrt{\frac{\lambda_2^4}{\cot^2\alpha_0 + \lambda_2^4}},$$

where $V_0$ is a volume of the unformed prefabricated shell; $a_1$ is a length of a semi-major axis of the first ellipsoid; $a_2$ is a length of a semi-major axis of the second ellipsoid; and $\alpha_0$ is a tension-compression stress dividing angle; and $$\alpha_0 = \arctan\frac{\sqrt{\lambda_1^2 - 2}}{\lambda_1^2}.$$

The calculation model of the volume difference between the unformed prefabricated shell and the formed ellipsoidal shell in step 102 is $$\Delta V = \frac{4\pi a_2^3}{3\lambda_F} - \frac{4\pi a_1^3}{3\lambda_1}\left(1 - \sqrt{\frac{\lambda_1^4}{\cot^2\alpha_0 + \lambda_1^4}}\right) - \frac{4\pi a_2^3}{3\lambda_2}\sqrt{\frac{\lambda_2^4}{\cot^2\alpha_0 + \lambda_2^4}},$$

$\Delta V$ is the volume difference between the unformed prefabricated shell and the formed ellipsoidal shell, and $\lambda_F$ is an axial length ratio of the formed ellipsoidal shell.

Embodiment 2

With reference to FIG. 2 to FIG. 6, FIG. 2 is a schematic flowchart of a method for controlling axial length of an ellipsoidal shell based on liquid volume loading according to the present invention. The method is implemented according to the following steps:

Step 1: Design an unformed prefabricated shell structure of a target ellipsoidal vessel with an axial length ratio greater than $\sqrt{2}$ to an ellipsoidal shell structure with double axial length ratios.

Figure 3:
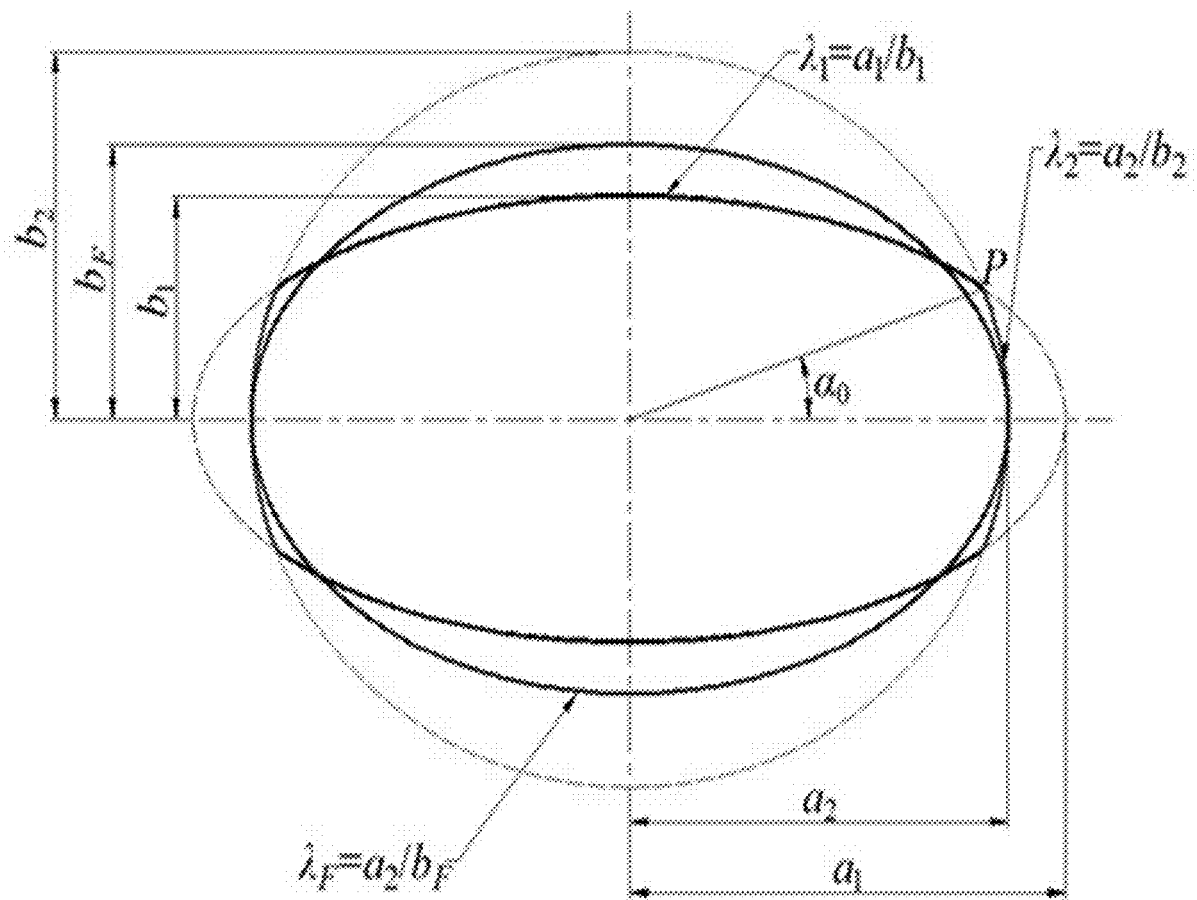
FIG. 3 is a schematic structural diagram of an unformed prefabricated shell with double axial length ratios of an ellipsoidal vessel according to an embodiment of the present invention.

To prevent the ellipsoidal vessel with an axial length ratio greater than $\sqrt{2}$ from being wrinkled during hydroforming due to the equatorial zonal compression stress, according to the patent ZL201310628487.3, structure design is conducted on the unformed prefabricated shell. The prefabricated shell structure used before hydroforming uses an ellipsoidal shell structure with double axial length ratios. As shown in FIG. 3, the ellipsoidal shell structure includes two segments of ellipsoidal shells whose axial length ratios are respectively $\lambda_1$ and $\lambda_2$. A sphere center angle corresponding to a dividing point P of the two segments of ellipsoidal shells is a tension-compression stress dividing angle $\alpha_0$. A part with a sphere center angle large than the dividing angle $\alpha_0$ includes a first segment of ellipsoidal shell with an axial length ratio $\lambda_1 > \sqrt{2}$, and a length of a major semi axis of the first segment of ellipsoidal shell is $a_1$ and a length of a minor semi-axis of the first segment of ellipsoidal shell is $b_1$; and a part with a sphere center angle smaller than the dividing angle $\alpha_0$ includes a second segment of ellipsoidal shell with an axial length ratio $1 < \lambda_2 < \sqrt{2}$, and a length of a major semi axis of the second segment of ellipsoidal shell is $a_2$ and a length of a minor semi-axis of the second segment of ellipsoidal shell is $b_2$. $\alpha_0$ is determined according to the axial length ratio $\lambda_1$ of the first segment of ellipsoidal shell.

$$\alpha_0 = \arctan\frac{\sqrt{A_1^2 - 2}}{A_{i2}} \quad (1)$$

Step 2: Obtain an inner-cavity volume of the target ellipsoidal vessel and an inner-cavity volume of the prefabricated shell, and establish a relation model of a volume change of the shell before and after the forming.

Figure 4:
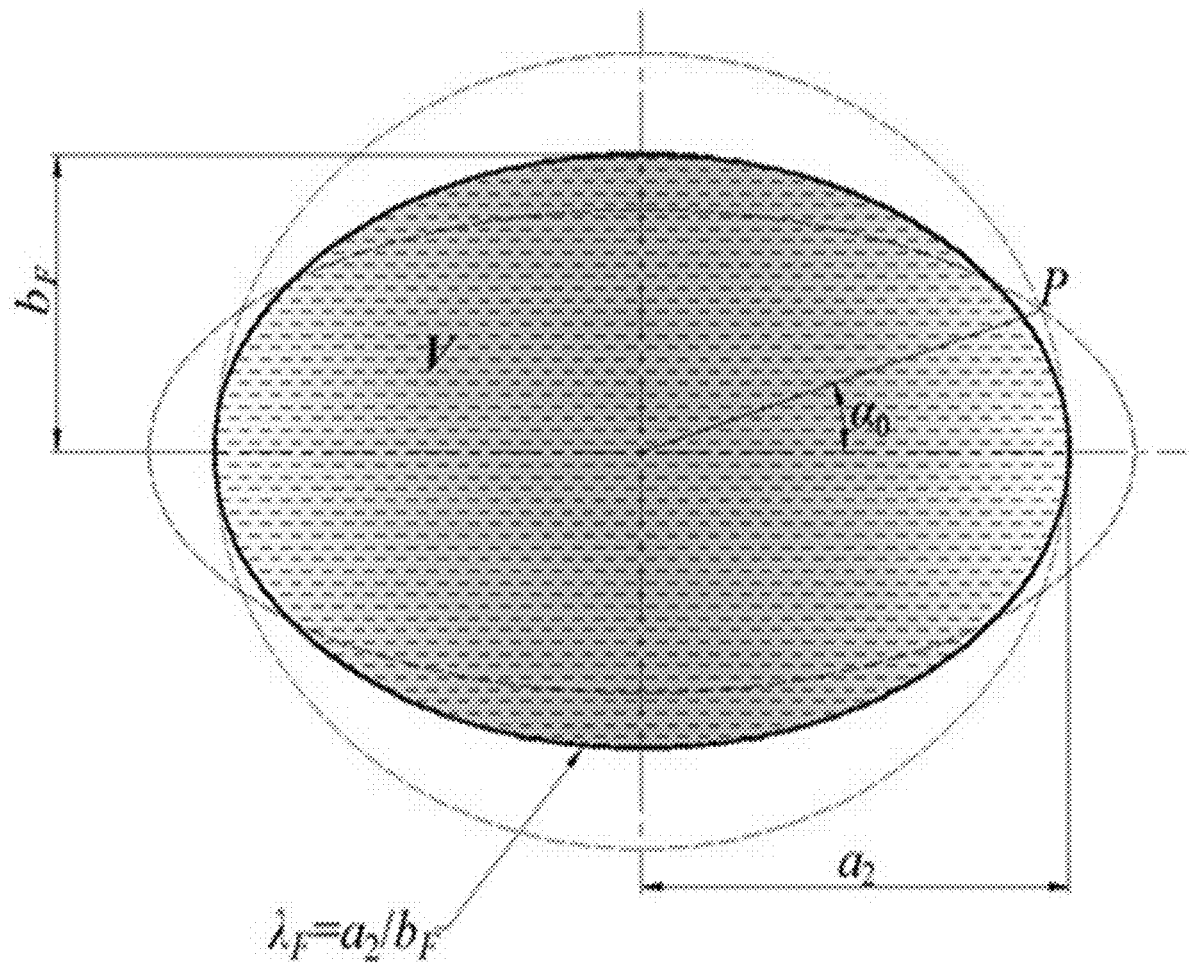
FIG. 4 is a schematic volume diagram of a formed ellipsoidal vessel according to an embodiment of the present invention.

During hydroforming of the prefabricated ellipsoidal shell with double axial length ratios $\lambda > \sqrt{2}$, curvature radiuses of different positions on the elliptical shell are different. As a result, two poles are first deformed, then an area on the shell at high latitudes is deformed and the deformation gradually extends to an equatorial region, and finally the equatorial region is deformed. During forming, a long axis of the shell hardly changes, that is, $a_2$ does not change. With an increase of a volume of liquid injected into the shell, internal liquid pressure increases. The first segment of ellipsoidal shell with an axial length ratio $\lambda_1 > \sqrt{2}$ and the second segment of ellipsoidal shell with an axial length ratio $1 < \lambda_2 < \sqrt{2}$ gradually become rounded at the boundary to form an ellipsoidal vessel with a single axial length ratio. The axial length ratio is $\lambda_F = a_2/b_F$. A schematic volume diagram of the formed ellipsoidal vessel is shown in FIG. 4, and a volume expression is as follows:

$$V = \frac{4\pi a_2^3}{3\lambda_F} \quad (2)$$

Figure 5:
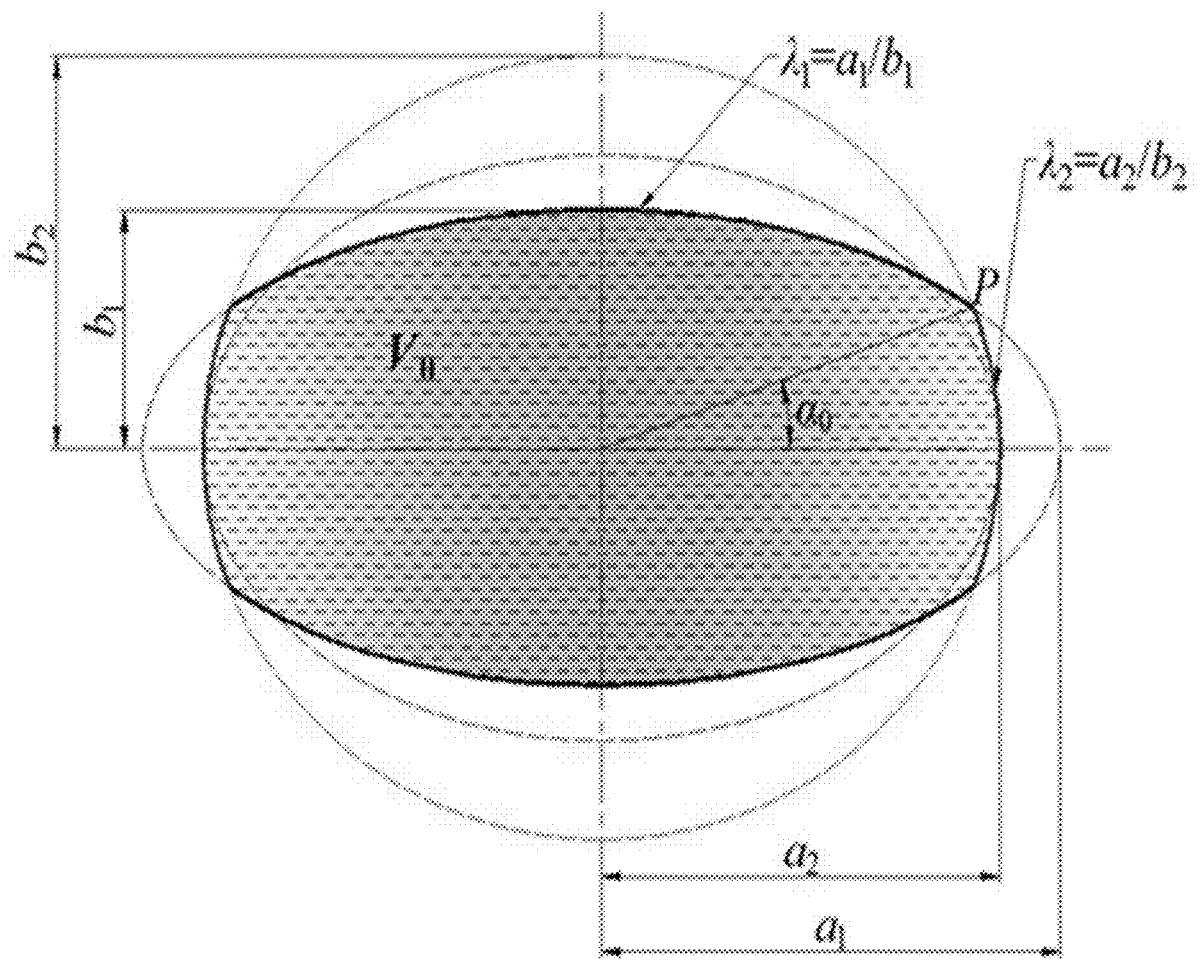
FIG. 5 is a schematic volume diagram of an unformed prefabricated ellipsoidal shell with double axial length ratios according to an embodiment of the present invention.
Figure 6:
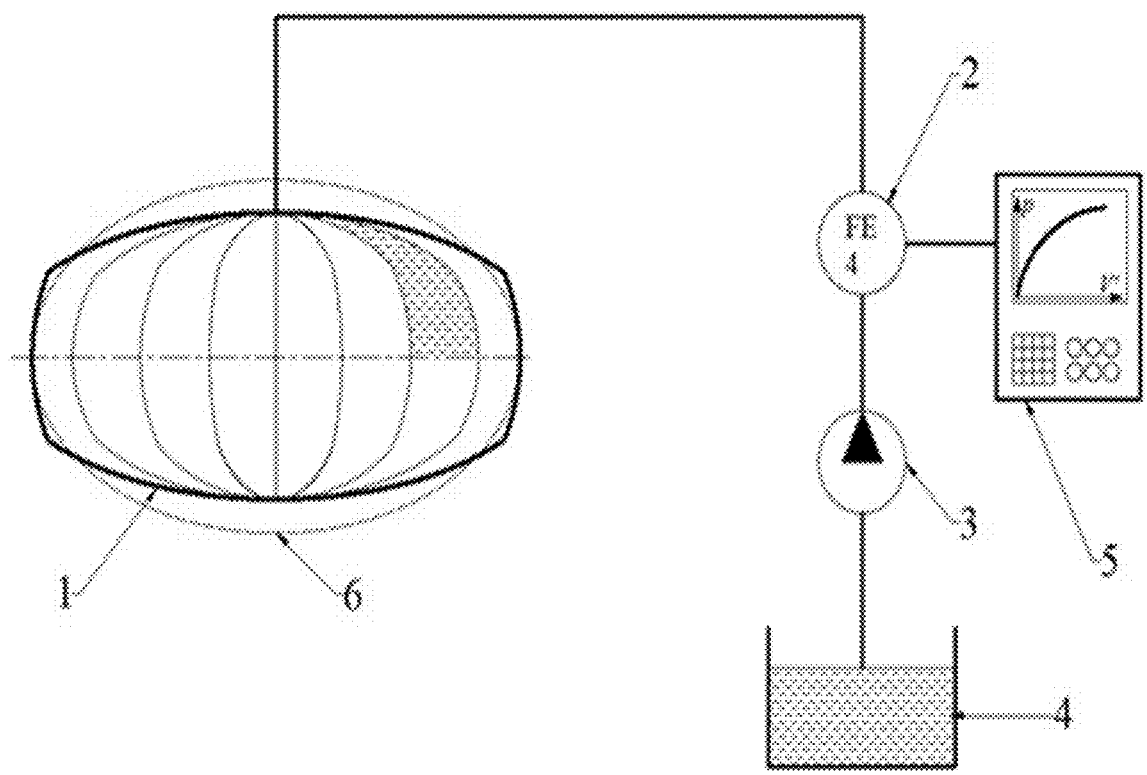
FIG. 6 is a schematic diagram of a hydroforming system of an ellipsoidal shell based on liquid volume loading, where 1—prefabricated ellipsoidal shell with double axial length ratios; 2—flowmeter; 3—pressure device; 4—water tank; 5—control system; and 6—ellipsoidal vessel.

For the unformed prefabricated ellipsoidal shell with double axial length ratios, the axial length ratios are respectively $\lambda_1$ and $\lambda_2$ and a tension-compression stress dividing angle is $\alpha_0$. A schematic volume diagram of the unformed prefabricated ellipsoidal shell is shown in FIG. 5, and the following volume expression of the ellipsoidal shell with double axial length ratios can be obtained through theoretical derivation:

$$V_0 = \frac{4\pi a_1^3}{3\lambda_1}\left(1 - \sqrt{\frac{\lambda_1^4}{\cot^2\alpha_0 + \lambda_1^4}}\right) + \frac{4\pi a_2^3}{3\lambda_2}\sqrt{\frac{\lambda_2^4}{\cot^2\alpha_0 + \lambda_2^4}} \quad (3)$$

According to formulas 2 and 3, a volume change $\Delta V$ and a volume change rate $V'$ generated when the prefabricated ellipsoidal shell with double axial length ratios are formed into the ellipsoidal vessel with a single axial length ratio are shown in formulas 4 and 5.

$$\Delta V = V - V_0 = \frac{4\pi a_2^3}{3\lambda_F} - \frac{4\pi a_1^3}{3\lambda_1}\left(1 - \sqrt{\frac{\lambda_1^4}{\cot^2\alpha_0 + \lambda_1^4}}\right) - \frac{4\pi a_2^3}{3\lambda_2}\sqrt{\frac{\lambda_2^4}{\cot^2\alpha_0 + \lambda_2^4}} \quad (4)$$

$$V' = \frac{V - V_0}{V_0} = \frac{1}{\frac{\lambda_F}{\lambda_1}\left(1 - \sqrt{\frac{\lambda_1^4}{\cot^2\alpha_0 + \lambda_1^4}}\right)\frac{a_1^3}{a_2^3} + \frac{\lambda_F}{\lambda_2}\sqrt{\frac{\lambda_2^4}{\cot^2\alpha_0 + \lambda_2^4}}} - 1 = \frac{1}{\frac{\lambda_F}{\lambda_1}\left(1 - \sqrt{\frac{\lambda_1^4}{\cot^2\alpha_0 + \lambda_1^4}}\right)\left(\frac{2\lambda_1^4 - 2\lambda_1^2}{\lambda_1^4 + \lambda_1^2\lambda_2^2 - 2\lambda_2^2}\right)^{3/2} + \frac{\lambda_F}{\lambda_2}\sqrt{\frac{\lambda_2^4}{\cot^2\alpha_0 + \lambda_2^4}}} - 1 \quad (5)$$

Step 3: Conduct reversing design of parameters and a volume change rate of the prefabricated ellipsoidal shell structure with double axial length ratios.

It can be learned from formula 5 that, an axial length ratio $\lambda_F$ of a target ellipsoidal vessel with a single axial length ratio is a function of the axial length ratios $\lambda_1$ and $\lambda_2$ and the volume change rate $V'$ of the prefabricated shell, that is, $\lambda_F = f(\lambda_1, \lambda_2, V')$. According to this relation expression, on the premise that the dimension $\lambda_F$ of the target ellipsoidal vessel is known, reversing design of the parameters of the prefabricated ellipsoidal shell structure with double axial length ratios is conducted, and in this case, $V' = f(\lambda_1, \lambda_2)$. The axial length ratio $\lambda_2$ of the second segment of ellipsoidal shell is designed to a fixed value in a range of $1 < \lambda_2 < \sqrt{2}$. In this case, there is a one-to-one correspondence between the volume change rate $V'$ and the axial length ratio $\lambda_1$ of the first segment of ellipsoidal shell, and the volume change rate $V'$ of the ellipsoidal shell can be obtained when it is ensured that a value of $\lambda_1$ is greater than $\sqrt{2}$. Therefore, reversing design of the parameters of the prefabricated ellipsoidal shell structure with double axial length ratios can be conducted by using the relation model of the volume change of the shell before and after the forming in step 2. For an ellipsoidal vessel with a target dimension, different prefabricated shells with double axial length ratios can be designed, but volume change rates $V'$ of the prefabricated shells change accordingly. In other words, different prefabricated ellipsoidal shells with double axial length ratios can be used to form one target ellipsoidal vessel provided that the relation $\lambda_F = f(\lambda_1, \lambda_2, V')$ in formula 5 is satisfied.

Step 4: Determine a liquid volume increment.

Based on the requirement of an axial length ($a_F = a_2$, $b_F$) of a target ellipsoidal vessel, a volume $V$ of a final target ellipsoidal vessel can be calculated according to formula 2. Then a volume $V_0$ of the unformed prefabricated ellipsoidal shell with double axial length ratios can be obtained according to formula 5 based on and the volume change rate $V'$ obtained through reversing design in step 3. Finally, the liquid volume increment $\Delta V$ required during forming can be determined according to formula 4. In addition, the liquid volume increment can also be determined by using another method. An axial length ($a_F = a_2$, $b_F$) and a target axial length ratio $\lambda_F$ of the target ellipsoidal vessel, and a group of parameters $\lambda_1$ and $\lambda_2$ of the ellipsoidal shell with double axial length ratios that is obtained through reversing design in step 3 are known, where $a_2$ is equal to a dimension of a long axis of a target ellipsoidal shell. The tension-compression stress dividing angle $\alpha_0$ is calculated according to the axial length ratio $\lambda_1$ of the first segment of ellipsoidal shell, to calculate a point ($x_0$, $y_0$) of the dividing angle, and the point $(x_0, y_0)$ is substituted into a formula of the first segment of ellipsoidal shell to obtain the length $a_1$ of a semi-major axis of the first segment of ellipsoidal shell. According to formula 4, a volume change $\Delta V$ of the formed ellipsoidal vessel with the axial length ratio $\lambda_F$ before and after the forming can be obtained, that is, the liquid volume increment $\Delta V$ required during forming can be obtained.

Step 5: Inject liquid into the prefabricated shell with double axial length ratios, and control the axial lengths of the ellipsoidal shell according to the liquid volume increment to form the ellipsoid vessel with an axial length ratio greater than $\sqrt{2}$.

Liquid is pumped from a water tank 4 by a pressure device 3, and the liquid is injected into a prefabricated ellipsoidal shell 1 with double axial length ratios that is designed according to the foregoing steps. After the prefabricated ellipsoidal shell 1 is filled, a flowmeter 2 and a control system 5 are used to control the liquid volume increment required during forming. With the increase of a liquid injection amount, liquid pressure in the formed shell also keeps increasing, and the shell is subject to plastic deformation. Later, when the liquid injection amount reaches the liquid volume increment $\Delta V$ calculated in step 4, hydroforming is completed to obtain an ellipsoidal vessel 6 with an axial length ratio $\lambda_F$. During forming, the liquid pressure is relatively low, a larger dimension of the shell indicates lower forming pressure. Therefore, there is no need to consider a problem of liquid volume compression. In a liquid filling system, the liquid injection amount is controlled by the flowmeter 2. When the injection amount reaches a specified value, the injection amount is fed back to the control system 5, and the liquid filling is stopped and the forming process is completed.

In this implementation, a mathematical relation model of a volume change before and after the forming of an ellipsoid vessel is established. If the axial length of a target ellipsoid vessel is known, reversing design of dimension parameters and a volume change rate of an unformed prefabricated ellipsoidal shell with double axial length ratios can be conducted. Based on that an axial length of the formed ellipsoid vessel can be controlled by controlling the volume of liquid injected into the shell during the forming. The method effectively overcomes the following disadvantage existing when forming is controlled by controlling liquid pressure in an existing hydroforming process of an ellipsoid vessel: When a liquid pressure control method is used, it is impossible to accurately determine specific liquid pressure required when an axial length of an ellipsoid vessel can achieve a designed accuracy requirement. The process in the present invention is simple and easy to implement without considering differences in materials and wall thicknesses during forming (existing pressure control needs to be considered). Moreover, it can control and adjust the dimension accuracy of an axial length of a shell, so as to be suitable for fabricating large-size ellipsoidal vessel on site.

In Embodiment 3, this implementation is described with reference of FIG. 2 to FIG. 6, a difference between this implementation and Embodiment 2 lies in that: In step 3, according to a length $a_F$ of a semi-major axis of the target ellipsoidal vessel, a group of parameters $\lambda_1$ and $\lambda_2$ of the prefabricated shell with double axial length ratios is designed directly, so that the following conditions are satisfied: $a_2 = a_F$, $\lambda_1 > \sqrt{2}$, and $1 < \lambda_2 < \sqrt{2}$; and after the parameters $\lambda_1$ and $\lambda_2$ are substituted into formula 5, it can be learned that a volume change rate V' and an axial length $\lambda_F$ of a final target ellipsoidal shell satisfy a one-to-one function relationship $\lambda_F = f(V')$. In other words, for one prefabricated ellipsoidal shell with double axial length ratios, during hydroforming, the axial length $\lambda_F$ of the final target ellipsoidal vessel can be controlled by controlling the volume change rate V'. Others in this implementation are the same as those described in Embodiment 2.

Figure 7:
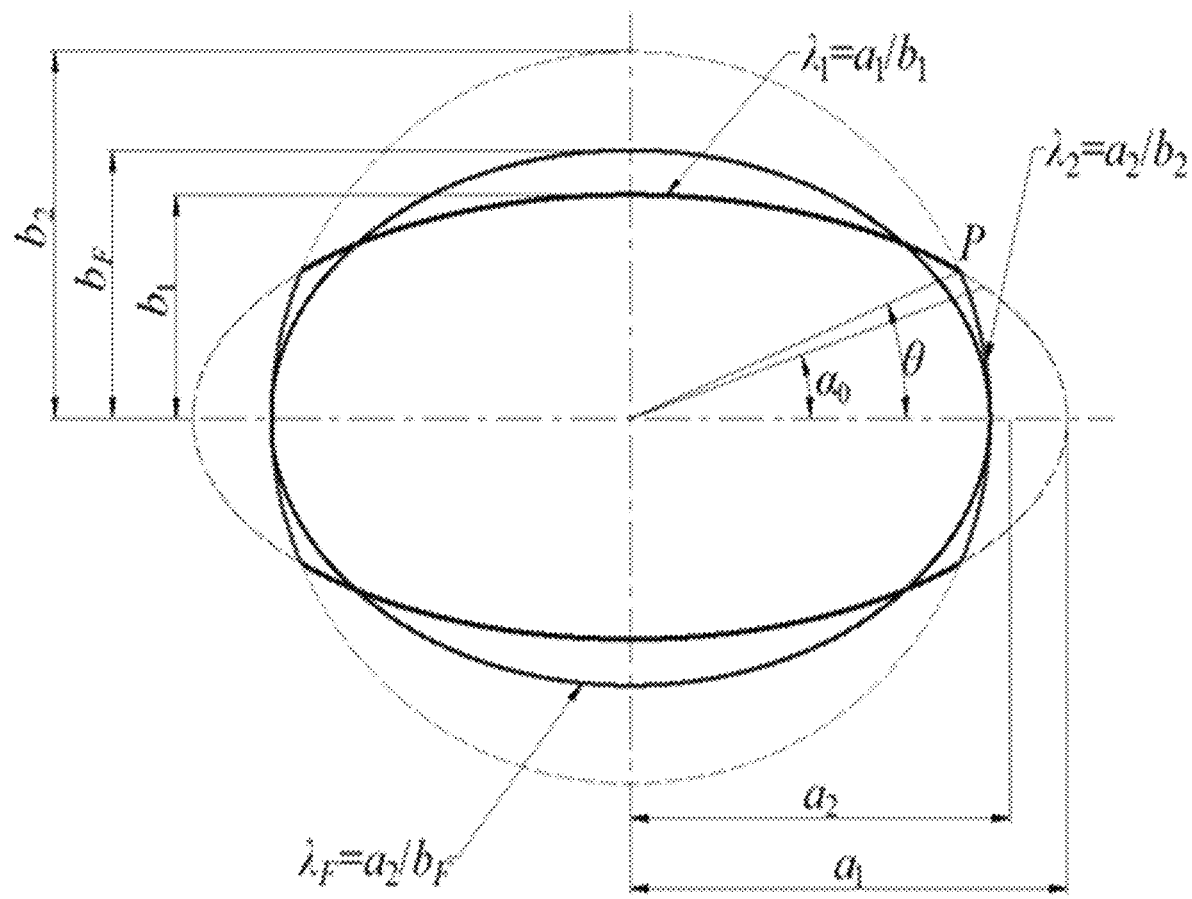
FIG. 7 is a schematic structural diagram of an unformed prefabricated shell with double axial length ratios whose sphere center angle $\theta$ is larger than the tension-compression stress dividing angle $\alpha_0$.

In Embodiment 4, this implementation is described with reference to FIG. 7, a difference between this implementation and Embodiment 2 or Embodiment 3 lies in that: A sphere center angle $\theta$ corresponding to a dividing point P of two segments of ellipsoidal shells is a value larger than a tension-compression stress dividing angle $\alpha_0$, and usually falls within a range of $(\alpha_0 + 5°)$. In formulas 2 to 4, an angle $\theta$ is used to calculate an inner-cavity volume of a target ellipsoidal vessel and an inner-cavity volume of a prefabricated shell, and a volume change rate is calculated according to formula 6. Others in this implementation are the same as those described in Embodiment 2 or Embodiment 3.

$$V' = \frac{V - V_0}{V_0} = \frac{1}{\frac{\lambda_F}{\lambda_1}\left(1 - \sqrt{\frac{\lambda_1^4}{\cot^2\theta + \lambda_1^4}}\right)\frac{a_1^3}{a_2^3} + \frac{\lambda_F}{\lambda_2}\sqrt{\frac{\lambda_2^4}{\cot^2\theta + \lambda_2^4}}} - 1 \quad (6)$$

The following further describes the present invention with reference to specific examples.

Example 1 (corresponding to Embodiment 2): A prefabricated shell structure used before forming of an ellipsoidal vessel is an ellipsoidal shell structure with double axial length ratios. As shown in FIG. 3, the ellipsoidal shell structure includes two segments of ellipsoidal shells whose axial length ratios are respectively $\lambda_1$ and $\lambda_2$. A sphere center angle corresponding to a dividing point P of the two segments of ellipsoidal shells is equal to the tension-compression stress dividing angle $\alpha_0$. For a target ellipsoidal shell whose semi-major axis has a length of $a_F = 3000$ mm and minor semi-axis has a length of $b_F = 2000$ mm, an axial length ratio of the target ellipsoidal shell is $\lambda_F = 1.5$. According to formula 2, it is learned through calculation that a volume V after hydroforming is 75.4 m$^3$. In addition, by substituting $\lambda_F = 1.5$ into formula 5, a relation $V' = f(\lambda_1, \lambda_2)$ can be obtained, as shown in formula 7, where $\alpha_0$ is determined according to the axial length ratio $\lambda_1$ of a first segment of ellipsoidal shell, refer to formula 1.

$$V' = \frac{1}{\frac{1.5}{\lambda_1}\left(1 - \sqrt{\frac{\lambda_1^4}{\cot^2\alpha_0 + \lambda_1^4}}\right)\left(\frac{2\lambda_1^4 - 2\lambda_1^2}{\lambda_1^4 + \lambda_1^2\lambda_2^2 - 2\lambda_2^2}\right)^{3/2} + \frac{1.5}{\lambda_2}\sqrt{\frac{\lambda_2^4}{\cot^2\alpha_0 + \lambda_2^4}}} - 1 \quad (7)$$

For the target ellipsoidal shell with an axial length ratio $\lambda_F = 1.5$, reversing design of a plurality of groups of parameters and corresponding volume change rates of an unformed prefabricated ellipsoidal shell with double axial length ratios can be conducted according to formula 7, as shown in Table 1. In Table 1, only parameters of a prefabricated ellipsoidal shell with double axial length ratios (an axial length ratio of a second segment of ellipsoidal shell is $\lambda_2=1.4$), and a volume change rate corresponding to the target ellipsoidal shell with an axial length ratio $\lambda_F=1.5$ are listed. When the axial length ratio of the second segment of ellipsoidal shell is changed, a plurality of prefabricated shells can be designed, and so on. It can be learned from the above that different prefabricated ellipsoidal shells with double axial length ratios can be formed into one target ellipsoidal shell by controlling a volume of liquid injected into the ellipsoidal shells during hydroforming.

A first prefabricated ellipsoidal shell (shell-1) with double axial length ratios in Table 1 is used as an example herein, to calculate the liquid volume increment ΔV during hydroforming. According to formula 3 or 5, it is learned through calculation that a volume $V_0$ before hydroforming is 44.90 m³; and according to formula 4, it is learned through calculation that a liquid volume increment ΔV during hydroforming is 30.50 m³. During hydroforming, liquid is injected into the prefabricated ellipsoidal shell with double axial length ratios first. After the prefabricated ellipsoidal shell is filled, a flowmeter 2 and a control system 5 are used to control a liquid volume increment required during forming. During the forming, two poles are first deformed, then an area on the shell at high latitudes is deformed and the deformation gradually extends to an equatorial region, and finally the equatorial region is deformed. A long axis of the shell hardly changes during the forming. With an increase of a volume of liquid injected into the shell, internal liquid pressure increases. The first segment of ellipsoidal shell with an axial length ratio $\lambda_1 > \sqrt{2}$ and the second segment of ellipsoidal shell with an axial length ratio $1 < \lambda_2 < \sqrt{2}$ gradually become rounded at the boundary. When a liquid injection amount reaches 30.50 m³, the prefabricated ellipsoidal shell with double axial length ratios is formed into an ellipsoidal vessel with a single length ratio of $\lambda_F=1.5$ whose semi-major axis and minor semi-axis respectively have lengths of 3000 mm and 2000 mm. A forming principle of a prefabricated ellipsoidal shell with double axial length ratios and of another dimension is the same as that described above, and there is only a difference in a liquid volume increment during forming. In this embodiment, dimension accuracy of a formed ellipsoidal vessel is increased by 10% compared with a pressure control method.

Example 2 (corresponding to Embodiment 3): A prefabricated shell structure used before forming of an ellipsoidal vessel is an ellipsoidal shell structure with double axial length ratios. As shown in FIG. 3, the ellipsoidal shell structure includes two segments of ellipsoidal shells whose axial length ratios are respectively $\lambda_1$ and $\lambda_2$. A sphere center angle corresponding to a dividing point P of the two segments of ellipsoidal shells is equal to the tension-compression stress dividing angle $\alpha_0$. For a target ellipsoidal shell whose semi-major axis has a length of $a_F=3000$ mm, parameters of the prefabricated ellipsoidal shell with double axial length ratios are respectively designed to $\lambda_1=2.5$ and $\lambda_2=1.4$. During the forming, a long axis of the shell hardly changes, that is, $a_2$ does not change, and $a_2=a_F=3000$ mm and $b_2=2143$ mm. When the sphere center angle corresponding to the dividing point P of the two segments of ellipsoidal shells is just equal to the tension-compression stress dividing angle $\alpha_0$, the following condition is satisfied:

$$\frac{a_1}{a_2} = \sqrt{\frac{2\lambda_1^4 - 2\lambda_1^2}{\lambda_1^4 + \lambda_1^2\lambda_2^2 - 2\lambda_2^2}} \qquad (8)$$

It can be learned through calculation according to formula 8 that, when $\lambda_1=2.5$, $\lambda_2=1.4$, and $a_2=a_F=3000$ mm, $a_1=3530$ mm, and $b_1=1412$ mm. In addition, it can be learned through calculation according to formula 1 that, the tension-compression stress dividing angle is $\alpha_0=18.26$. It can be learned by substituting the foregoing parameters into formula 5 that, a volume change rate V' and an axial length ratio $\lambda_F$ of a final target ellipsoidal shell satisfy a one-to-one function relationship $\lambda_F=f(V')$, as shown by formula 9.

$$\lambda_F = \frac{2.207}{V'+1} \qquad (9)$$

According to formula 9, for one prefabricated ellipsoidal shell with double axial length ratios: $\lambda_1=2.5$ ($a_1=3530$ mm, and $b_1=1412$ mm) and $\lambda_2=1.4$ ($a_2=a_F=3000$ mm, and $b_2=2143$ mm), an axial length ratio $\lambda_F$ of a final target ellipsoidal vessel can be controlled by controlling the volume change rate V' during hydroforming, as shown in Table 2.

TABLE 1

| Prefabricated shell | $\lambda_1$ | $\alpha_0/°$ | $a_1$/mm | $b_1$/mm | $\lambda_2$ | $a_2$/mm | $b_2$/mm | V'/% | ΔV/m³ |
|---|---|---|---|---|---|---|---|---|---|
| Shell-1 | 3.0 | 16.38 | 3699 | 1233 | 1.4 | 3000 | 2143 | 67.94 | 30.50 |
| Shell-2 | 2.9 | 16.75 | 3670 | 1265 | 1.4 | 3000 | 2143 | 63.75 | 29.35 |
| Shell-3 | 2.8 | 17.13 | 3639 | 1299 | 1.4 | 3000 | 2143 | 59.57 | 28.15 |
| Shell-4 | 2.7 | 17.51 | 3605 | 1335 | 1.4 | 3000 | 2143 | 55.41 | 26.88 |
| Shell-5 | 2.6 | 17.89 | 3569 | 1373 | 1.4 | 3000 | 2143 | 51.26 | 25.55 |
| Shell-6 | 2.5 | 18.26 | 3530 | 1412 | 1.4 | 3000 | 2143 | 47.12 | 24.15 |
| Shell-7 | 2.4 | 18.61 | 3489 | 1454 | 1.4 | 3000 | 2143 | 42.98 | 22.66 |
| Shell-8 | 2.3 | 18.93 | 3444 | 1498 | 1.4 | 3000 | 2143 | 38.83 | 21.09 |
| Shell-9 | 2.2 | 19.20 | 3397 | 1544 | 1.4 | 3000 | 2143 | 34.67 | 19.41 |
| Shell-10 | 2.1 | 19.39 | 3346 | 1594 | 1.4 | 3000 | 2143 | 30.48 | 17.61 |
| Shell-11 | 2.0 | 19.47 | 3293 | 1646 | 1.4 | 3000 | 2143 | 26.22 | 15.66 |

TABLE 2

| Target ellipsoidal vessel | $\lambda_F$ | $a_F$/mm | $b_F$/mm | V'/% | V/m³ | $V_0$/m³ | ΔV/m³ |
|---|---|---|---|---|---|---|---|
| Vessel-1 | 1.8 | 3000 | 1667 | 22.60 | 62.8 | 51.3 | 11.6 |
| Vessel-2 | 1.7 | 3000 | 1765 | 29.81 | 66.5 | 51.3 | 15.3 |
| Vessel-3 | 1.6 | 3000 | 1875 | 37.92 | 70.7 | 51.3 | 19.4 |
| Vessel-4 | 1.5 | 3000 | 2000 | 47.12 | 75.4 | 51.3 | 24.1 |
| Vessel-5 | 1.4 | 3000 | 2143 | 57.63 | 80.8 | 51.3 | 29.5 |

A target vessel 3 in Table 2 is used as an example herein, if an axial length ratio of a final ellipsoidal vessel is expected to be controlled to be $\lambda_F=1.6$ according to formula 9, it is learned through calculation that a volume change rate during the forming is 37.92%; and according to formula 2, it is learned through calculation that a volume V after hydroforming is 70.7 m³. According to formula 3 or 5, it is learned through calculation that a volume $V_0$ before hydroforming is 51.3 m³. According to formula 4, it is learned through calculation that a liquid volume increment ΔV during hydroforming is 19.4 m³. During hydroforming, liquid is injected into the prefabricated ellipsoidal shell with double axial length ratios first. After the prefabricated ellipsoidal shell is filled, a flowmeter 2 and a control system 5 are used to control a liquid volume increment required during forming. During the forming, two poles are first deformed, then an area on the shell at high latitudes is deformed and the deformation gradually extends to an equatorial region, and finally the equatorial region is deformed. The long axis of the shell hardly changes during the forming. With an increase of a volume of liquid injected into the shell, internal liquid pressure gradually increases. A first segment of ellipsoidal shell with an axial length ratio $\lambda_1 > \sqrt{2}$ and a second segment of ellipsoidal shell with an axial length ratio $1<\lambda_2<\sqrt{2}$ gradually become rounded at the boundary. When a liquid injection amount reaches 19.4 m³, the prefabricated ellipsoidal shell with double axial length ratios is formed into an ellipsoidal vessel with a single length ratio of $\lambda_F=1.6$ whose semi-major axis and minor semi-axis respectively have lengths of 3000 mm and 1875 mm. Ellipsoidal vessels with different axial lengths can be obtained by changing a volume increment of liquid injected into the prefabricated shell. In this embodiment, dimension control accuracy of a formed ellipsoidal vessel is increased by 12% compared with a pressure control method.

Example 3 (corresponding to Embodiment 4): A prefabricated shell structure used before forming of an ellipsoidal vessel is an ellipsoidal shell structure with double axial length ratios. As shown in FIG. 3, the ellipsoidal shell structure includes two segments of ellipsoidal shells whose axial length ratios are respectively $\lambda_1$ and $\lambda_2$. The sphere center angle θ corresponding to the dividing point P of the two segments of ellipsoidal shells is a value larger than a tension-compression stress dividing angle $\alpha_0$, and usually falls within a range of $(\alpha_0+5°)$. For a target ellipsoidal shell whose semi-major axis has a length of $a_F=3000$ mm and minor semi-axis has a length of $b_F=2000$ mm, an axial length ratio of the target ellipsoidal shell is $\lambda_F=1.5$. According to formula 2, it is learned through calculation that a volume V after hydroforming is 75.4 m³. In addition, by substituting $\lambda_F=1.5$ into formula 5, a relation $V'=f(\lambda_1,\lambda_2)$ can be obtained, as shown in formula 10, where θ is selected according to $\alpha_0$, and $a_2=a_F=3000$ mm.

$$V' = \frac{1}{\frac{1.5}{\lambda_1}\left(1 - \sqrt{\frac{\lambda_1^4}{\cot^2\theta + \lambda_1^4}}\right)\frac{a_1^3}{a_2^3} + \frac{1.5}{\lambda_2}\sqrt{\frac{\lambda_2^4}{\cot^2\theta + \lambda_2^4}}} - 1 \quad (10)$$

During the forming, a long axis of the shell hardly changes, that is, $a_2$ does not change, and $a_2=a_F=3000$ mm. The formulas of the first segment of ellipsoidal shell and the second segment of ellipsoidal shell are shown as formula 11. Coordinates $(x_0, y_0)$ of a dividing point P of the two segments of ellipsoidal shells satisfy $y_0=\tan\theta \times x_0$. If the coordinate value is substituted into formula 11, a relationship between lengths $a_1$ and $a_2$ of semi-major axes of the first segment of ellipsoidal shell and the second segment of ellipsoidal shell can be calculated when the double axial length ratios $\lambda_1$ and $\lambda_2$ are selected, as shown by formula 12.

$$\frac{x^2}{a_1^2} + \frac{\lambda_1^2 y^2}{a_1^2} = 1 \text{ and } \frac{x^2}{3000^2} + \frac{\lambda_2^2 y^2}{3000^2} = 1 \quad (11)$$

$$\frac{a_1}{a_2} = \sqrt{\frac{1 + \lambda_1^2 \tan^2\theta}{1 + \lambda_2^2 \tan^2\theta}} \quad (12)$$

For the target ellipsoidal shell with an axial length ratio $\lambda_F=1.5$, reversing design of a plurality of groups of parameters and corresponding volume change rates of an unformed prefabricated ellipsoidal shell with double axial length ratios can be conducted according to formulas 10 and 12, as shown in Table 3. In Table 3, only parameters of a prefabricated ellipsoidal shell with double axial length ratios (the axial length ratio of the second segment of ellipsoidal shell is $\lambda_2=1.4$ and the sphere center angle is θ=20°) and a volume change rate corresponding to the target ellipsoidal shell with an axial length ratio $\lambda_F=1.5$ are listed. When the axial length ratio of the second segment of ellipsoidal shell or the sphere center angle is changed, a plurality of prefabricated shells can be designed, and so on. It can be learned from the above that different prefabricated ellipsoidal shells with double axial length ratios can be formed into one target ellipsoidal shell by controlling a volume of liquid injected into the ellipsoidal shells during hydroforming.

TABLE 3

| Prefabricated shell | $\lambda_1$ | $\alpha_0/°$ | $\theta/°$ | $a_1$/mm | $b_1$/mm | $\lambda_2$ | $a_2$/mm | $b_2$/mm | V'/% | $\Delta V/m^3$ |
|---|---|---|---|---|---|---|---|---|---|---|
| Shell-1 | 3.0 | 16.38 | 20 | 3958 | 1319 | 1.4 | 3000 | 2143 | 48.75 | 24.71 |
| Shell-2 | 2.9 | 16.75 | 20 | 3887 | 1340 | 1.4 | 3000 | 2143 | 47.53 | 24.29 |
| Shell-3 | 2.8 | 17.13 | 20 | 3816 | 1363 | 1.4 | 3000 | 2143 | 46.14 | 23.80 |
| Shell-4 | 2.7 | 17.51 | 20 | 3748 | 1388 | 1.4 | 3000 | 2143 | 44.55 | 23.24 |
| Shell-5 | 2.6 | 17.89 | 20 | 3680 | 1415 | 1.4 | 3000 | 2143 | 42.73 | 22.57 |
| Shell-6 | 2.5 | 18.26 | 20 | 3614 | 1446 | 1.4 | 3000 | 2143 | 40.66 | 21.80 |
| Shell-7 | 2.4 | 18.61 | 20 | 3549 | 1479 | 1.4 | 3000 | 2143 | 38.30 | 20.88 |
| Shell-8 | 2.3 | 18.93 | 20 | 3486 | 1516 | 1.4 | 3000 | 2143 | 35.61 | 19.80 |
| Shell-9 | 2.2 | 19.20 | 20 | 3424 | 1557 | 1.4 | 3000 | 2143 | 32.56 | 18.52 |
| Shell-10 | 2.1 | 19.39 | 20 | 3364 | 1602 | 1.4 | 3000 | 2143 | 29.10 | 17.00 |
| Shell-11 | 2.0 | 19.47 | 20 | 3306 | 1653 | 1.4 | 3000 | 2143 | 25.21 | 15.18 |

The sixth prefabricated ellipsoidal shell (shell-6) with double axial length ratios in Table 3 is used as an example herein, to calculate the liquid volume increment $\Delta V$ during hydroforming. According to formula 3 or 5, it is learned through calculation that a volume $V_0$ before hydroforming is 53.60 m$^3$; and according to formula 4, it is learned through calculation that a liquid volume increment $\Delta V$ during hydroforming is 21.80 m$^3$. During hydroforming, liquid is injected into the prefabricated ellipsoidal shell with double axial length ratios first. After the prefabricated ellipsoidal shell is filled, a flowmeter 2 and a control system 5 are used to control a liquid volume increment required during forming. During the forming, two poles are first deformed, then an area on the shell at high latitudes is deformed and the deformation gradually extends to an equatorial region, and finally the equatorial region is deformed. A long axis of the shell hardly changes during the forming. With an increase of a volume of liquid injected into the shell, internal liquid pressure increases. A first segment of ellipsoidal shell with an axial length ratio $\lambda_1 > \sqrt{2}$ and a second segment of ellipsoidal shell with an axial length ratio $1 < \lambda_2 < \sqrt{2}$ gradually become rounded at the boundary. When a liquid injection amount reaches 21.80 m$^3$, the prefabricated ellipsoidal shell with double axial length ratios is formed into an ellipsoidal vessel with a single length ratio of $\lambda_F = 1.5$ whose semi-major axis and minor semi-axis respectively have lengths of 3000 mm and 2000 mm. A forming principle of a prefabricated ellipsoidal shell with double axial length ratios and of another dimension is the same as that described above, and there is only a difference in a liquid volume increment during forming. In this embodiment, dimension accuracy of a formed ellipsoidal vessel is increased by 13% compared with a pressure control method.

The present invention further provides a liquid filling system used for the axial length control method for an ellipsoidal shell based on liquid volume loading in the present invention, where the liquid filling system includes:

a liquid filling subsystem, configured to inject liquid into the unformed prefabricated shell described in the present invention;

a flowmeter, configured to measure liquid flow output by the liquid filling subsystem; and a control subsystem, configured to determine a volume of the liquid injected into the unformed prefabricated shell according to measurement data of the flowmeter; and when the volume of the liquid reaches the target volume described in the present invention, control the liquid filling subsystem to stop liquid filling.

Figure 8:
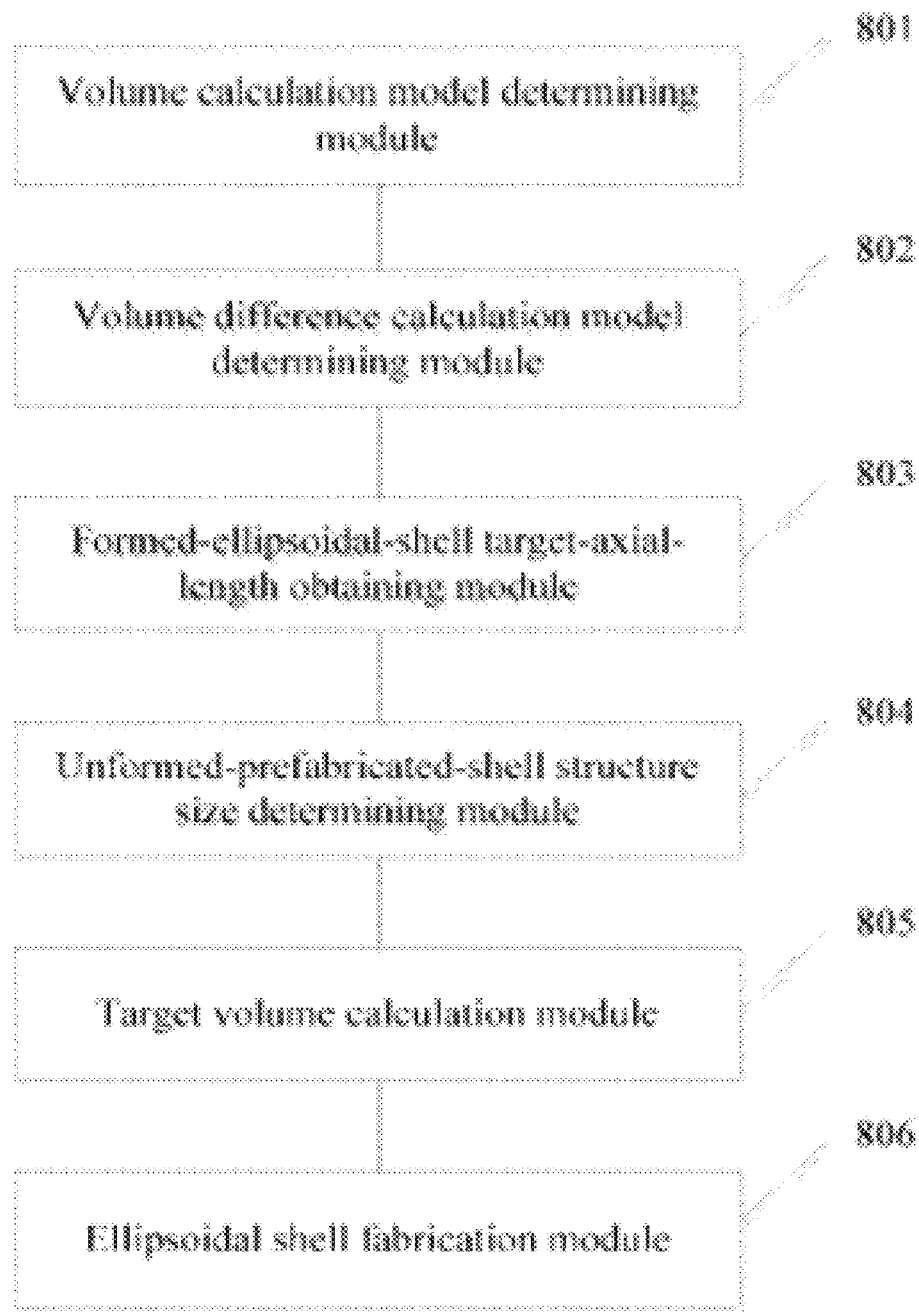
FIG. 8 is a structure diagram of an axial length control system for an ellipsoidal shell based on liquid volume loading according to an embodiment of the present invention.

The present invention further provides a system for controlling axial length of an ellipsoidal shell based on liquid volume loading. As shown in FIG. 8, the system includes:

a volume calculation model determining module 801, configured to determine a volume calculation model of an unformed prefabricated shell and a volume calculation model of a formed ellipsoidal shell, where the unformed prefabricated shell is hydro-bulged to obtain the formed ellipsoidal shell after liquid loading; the unformed prefabricated shell is symmetrical with respect to its center; the unformed prefabricated shell includes a plurality of segments of ellipsoidal shells; and the plurality of segments of ellipsoidal shells include ellipsoidal shells from different ellipsoids;

a volume difference calculation model determining module 802, configured to determine a calculation model of a volume difference between the unformed prefabricated shell and the formed ellipsoidal shell according to the volume calculation model of the unformed prefabricated shell and the volume calculation model of the formed ellipsoidal shell;

a formed-ellipsoidal-shell target-axial-length obtaining module 803, configured to obtain a target axial length of the formed ellipsoidal shell, where the target axial length is determined according to a requirement;

an unformed-prefabricated-shell structure size determining module 804, configured to determine a structure size of the unformed prefabricated shell according to the target axial length of the formed ellipsoidal shell;

a target volume calculation module 805, configured to substitute the target axial length of the formed ellipsoidal shell and the structure size of the unformed prefabricated shell into the volume difference calculation model, to obtain the volume difference between the formed ellipsoidal shell and the unformed prefabricated shell, and record the volume difference as a target volume; and an ellipsoidal shell fabrication module 806, configured to fabricate the unformed prefabricated shell according to the structure size of the unformed prefabricated shell, and inject liquid whose volume is the target volume into the unformed prefabricated shell to obtain the formed ellipsoidal shell.

In this embodiment, the unformed prefabricated shell is from two different ellipsoids, which are respectively recorded as the first ellipsoid and the second ellipsoid; an upper ellipsoidal shell and a lower ellipsoidal shell (a first segment of ellipsoidal shell) of the unformed prefabricated shell is from the first ellipsoid; and a middle ellipsoidal shell (a second segment of ellipsoidal shell) of the unformed prefabricated shell is from the second ellipsoid.

The volume calculation model determining module includes:

a volume calculation model determining unit, configured to determine the volume calculation model of the unformed prefabricated shell as $$V_0 = \frac{4\pi a_1^3}{3\lambda_1}\left(1 - \sqrt{\frac{\lambda_1^4}{\cot^2\alpha_0 + \lambda_1^4}}\right) + \frac{4\pi a_2^3}{3\lambda_2}\sqrt{\frac{\lambda_2^4}{\cot^2\alpha_0 + \lambda_2^4}},$$

where $V_0$ is a volume of the unformed prefabricated shell; $a_1$ is a length of a semi-major axis of the first ellipsoid; $\lambda_1$ is an axial length ratio of the first ellipsoid; $\lambda_2$ is an axial length ratio of the second ellipsoid; $a_2$ is a length of a semi-major axis of the second ellipsoid; $\alpha_0$ is a tension-compression stress dividing angle; and $$\alpha_0 = \arctan\frac{\sqrt{\lambda_1^2 - 2}}{\lambda_1^2},$$

$\lambda_1 > \sqrt{2}$, and $1 < \lambda_2 < \sqrt{2}$.

The volume difference calculation model determining module 802 specifically includes:

a volume difference calculation model determining unit, configured to determine the volume difference calculation model according to $$\Delta V = \frac{4\pi a_2^3}{3\lambda_F} - \frac{4\pi a_1^3}{3\lambda_1}\left(1 - \sqrt{\frac{\lambda_1^4}{\cot^2\alpha_0 + \lambda_1^4}}\right) - \frac{4\pi a_2^3}{3\lambda_2}\sqrt{\frac{\lambda_2^4}{\cot^2\alpha_0 + \lambda_2^4}},$$

where $\Delta V$ is the volume difference between the unformed prefabricated shell and the formed ellipsoidal shell, and $\lambda_F$ is an axial length ratio of the formed ellipsoidal shell.

The present invention proposes a method and system for controlling axial length of an ellipsoidal shell based on liquid volume loading. A mathematical relation model of a volume changes before and after the forming of an ellipsoid vessel is established, and a volume of liquid injected into a shell during the forming is controlled, so as to implement control on an axial length of the formed ellipsoid vessel. The process in the present invention is simple and easy to implement without considering differences in materials and wall thicknesses during forming. Moreover, it can control and adjust the dimension accuracy of an axial length of a shell. it is suitable for fabricating large-size ellipsoidal vessel on site.

Each embodiment of the present specification is described in a progressive manner, each embodiment focuses on the difference from other embodiments, and for the same and similar parts between the embodiments, cross reference may be made.

In this specification, specific examples are used for illustration of the principles and embodiments of the present invention. The description of the foregoing embodiments is used to help understand the method of the present invention and the core principles thereof. In addition, a person skilled in the art can make various modifications in terms of specific embodiments and scope of application in accordance with the teachings of the present invention. In conclusion, the content of this specification should not be construed as a limitation to the present invention.

What is claimed is:

1. A method for obtaining a formed ellipsoidal shell having an axial length that is controlled based on liquid volume loading, the method comprising:

determining a volume calculation model of an unformed prefabricated shell and a volume calculation model of the formed ellipsoidal shell, the volume calculation model of the formed ellipsoidal shell being defined by first structure parameters of the formed ellipsoidal shell, the unformed prefabricated shell being symmetrical with respect to its center; the unformed prefabricated shell comprising a plurality of segments of ellipsoidal shells; and the plurality of segments of ellipsoidal shells comprising ellipsoidal shells from different ellipsoids, the volume calculation model of the unformed prefabricated shell being defined by second structure parameters of the plurality of segments of ellipsoidal shells;

determining a calculation model of a volume difference between the unformed prefabricated shell and the formed ellipsoidal shell according to the volume calculation model of the unformed prefabricated shell and the volume calculation model of the formed ellipsoidal shell;

obtaining target values of lengths of a semi-major axis and a semi-minor axis of the formed ellipsoidal shell, wherein the target values are determined according to a requirement, the first structure parameters comprising the lengths of the semi-major axis and the semi-minor axis of the formed ellipsoidal shell;

determining values of the second structure parameters of the unformed prefabricated shell according to the target values of the lengths of the semi-major axis and the semi-minor axis of the formed ellipsoidal shell;

putting the target values of the lengths of the semi-major axis and the semi-minor axis of the formed ellipsoidal shell and the values of the second structure parameters of the unformed prefabricated shell into the calculation model of the volume difference to obtain the volume difference between the formed ellipsoidal shell and the unformed prefabricated shell, and recording the volume difference as a target volume; and fabricating the unformed prefabricated shell according to the second structure parameters of the unformed prefabricated shell, and injecting liquid having a volume that is equal to the target volume into the unformed prefabricated shell to obtain the formed ellipsoidal shell.

2. The method according to claim 1, wherein the plurality of segments of ellipsoidal shells is from two different ellipsoids, which are respectively recorded as a first ellipsoid and a second ellipsoid, wherein an upper ellipsoidal shell and a lower ellipsoidal shell of the unformed prefabricated shell is from the first ellipsoid and a middle ellipsoidal shell of the unformed prefabricated shell is from the second ellipsoid; and $\lambda_1 > \sqrt{2}$ and $1 < \lambda_2 < \sqrt{2}$, wherein $\lambda_1$ is an axial length ratio of the first ellipsoid, and $\lambda_2$, is an axial length ratio of the second ellipsoid.

3. The method according to claim 2, wherein the volume calculation model of the unformed prefabricated shell is expressed as:

$$V_0 = \frac{4\pi a_1^3}{3\lambda_1}\left(1 - \sqrt{\frac{\lambda_1^4}{\cot^2\alpha_0 + \lambda_1^4}}\right) + \frac{4\pi a_2^3}{3\lambda_2}\sqrt{\frac{\lambda_2^4}{\cot^2\alpha_0 + \lambda_2^4}},$$

wherein $V_0$ is a volume of the unformed prefabricated shell; $a_1$ is a length of a semi-major axis of the first ellipsoid; $a_2$ is a length of a semi-major axis of the second ellipsoid; and $\alpha_0$ is a tension-compression stress dividing angle; and $$\alpha_0 = \arctan \frac{\sqrt{\lambda_1^2 - 2}}{\lambda_1^2}.$$

4. The method according to claim 3, wherein the calculation model of the volume difference between the unformed prefabricated shell and the formed ellipsoidal shell is expressed as:

$$\Delta V = \frac{4\pi a_2^3}{3\lambda_F} - \frac{4\pi a_1^3}{3\lambda_1}\left(1 - \sqrt{\frac{\lambda_1^4}{\cot^2\alpha_0 + \lambda_1^4}}\right) - \frac{4\pi a_2^3}{3\lambda_2}\sqrt{\frac{\lambda_2^4}{\cot^2\alpha_0 + \lambda_2^4}},$$

wherein $\Delta V$ is the volume difference between the unformed prefabricated shell and the formed ellipsoidal shell, and $\lambda_F$ is an axial length ratio of the formed ellipsoidal shell.

* * * * *